(12) United States Patent
Ueno

(10) Patent No.: US 9,882,560 B2
(45) Date of Patent: Jan. 30, 2018

(54) TOUCH PANEL

(71) Applicant: FUJITSU COMPONENT LIMITED, Tokyo (JP)

(72) Inventor: Yutaka Ueno, Tokyo (JP)

(73) Assignee: FUJITSU COMPONENT LIMITED, Tokyo (JP)

( * ) Notice: Subject to any disclaimer, the term of this patent is extended or adjusted under 35 U.S.C. 154(b) by 341 days.

(21) Appl. No.: 13/866,149

(22) Filed: Apr. 19, 2013

(65) Prior Publication Data

US 2013/0278080 A1  Oct. 24, 2013

(30) Foreign Application Priority Data

Apr. 23, 2012  (JP) ................. 2012-098233

(51) Int. Cl.
*H03K 17/96* (2006.01)
*G06F 3/044* (2006.01)

(52) U.S. Cl.
CPC ............. *H03K 17/96* (2013.01); *G06F 3/044* (2013.01); *Y10T 307/786* (2015.04)

(58) Field of Classification Search
CPC ........... H02B 1/24; H01H 35/00; H02L 21/00
USPC ....................................................... 307/119
See application file for complete search history.

(56) References Cited

U.S. PATENT DOCUMENTS 6,204,897 B1 * 3/2001 Colgan ............... G02F 1/13338
349/111
6,259,490 B1 * 7/2001 Colgan ............... G02F 1/13338
349/12
6,373,474 B1 * 4/2002 Katabami ............... G06F 3/044
178/18.01
6,400,359 B1   6/2002 Katabami
6,504,269 B1 * 1/2003 Miyajima ............ H03K 17/962
307/112
2002/0101410 A1 * 8/2002 Sakata .................... G06F 3/044
345/173
2004/0135773 A1 * 7/2004 Bang ..................... G06F 3/0421
345/173
2005/0151463 A1 * 7/2005 Yamamoto ............. G02F 1/167
313/503

(Continued)

FOREIGN PATENT DOCUMENTS

CN        103472942     12/2013
JP        2000-076014    3/2000

(Continued)

*Primary Examiner* — Rexford Barnie
*Assistant Examiner* — Joseph Inge
(74) *Attorney, Agent, or Firm* — IPUSA, PLLC

(57) ABSTRACT

A touch panel includes a transparent dielectric substrate having a generally rectangular shape, a first conductive film formed on a first surface of the dielectric substrate, a second conductive film formed on a second surface of the dielectric substrate, four electrodes formed at four respective corners of the first conductive film, four current detecting units coupled to the four electrodes, respectively, and an alternating-current power supply configured to apply alternating-current voltage between the first conductive film and the second conductive film, wherein the alternating-current power supply is electrically coupled to the first conductive film through the four current detecting units and the four electrodes.

2 Claims, 5 Drawing Sheets

(56) References Cited

U.S. PATENT DOCUMENTS

| | | | | |
|---|---|---|---|---|
| 2006/0250373 | A1* | 11/2006 | Sakurai | G06F 3/044 345/173 |
| 2007/0262966 | A1* | 11/2007 | Nishimura | G06F 3/044 345/173 |
| 2008/0316182 | A1* | 12/2008 | Antila | G06F 3/044 345/173 |
| 2009/0040192 | A1 | 2/2009 | Haga | |
| 2009/0256820 | A1* | 10/2009 | Yanase | G06F 3/0412 345/174 |
| 2009/0272560 | A1* | 11/2009 | Tokunaga | H05K 3/106 174/126.1 |
| 2010/0013791 | A1* | 1/2010 | Haga | G06F 3/0412 345/174 |
| 2010/0026527 | A1* | 2/2010 | Nishimura | G06F 3/03547 341/5 |
| 2010/0108409 | A1* | 5/2010 | Tanaka | G06F 3/044 178/18.06 |
| 2010/0182277 | A1* | 7/2010 | Nakajima | G06F 3/045 345/174 |
| 2010/0259503 | A1* | 10/2010 | Yanase | G06F 3/0416 345/174 |
| 2011/0079501 | A1* | 4/2011 | Arai | G02F 1/13452 200/600 |
| 2011/0248962 | A1 | 10/2011 | Poupyrev et al. | |
| 2012/0075243 | A1* | 3/2012 | Doi | G06F 3/0416 345/174 |
| 2012/0126124 | A1* | 5/2012 | Nakatsugawa | G01T 1/2018 250/363.01 |

FOREIGN PATENT DOCUMENTS

| | | |
|---|---|---|
| JP | 2000-089911 | 3/2000 |
| JP | 2006-268262 | 10/2006 |
| JP | 2010-157029 | 7/2010 |
| JP | 2011-081538 | 4/2011 |
| JP | 2011-221676 | 11/2011 |

* cited by examiner

TOUCH PANEL

BACKGROUND OF THE INVENTION

1. Field of the Invention

The disclosures herein relate to a touch panel.

2. Description of the Related Art

A touch panel (i.e., touchscreen panel) is an input device that allows input to be directly entered into a display, and is generally placed in front of the display. Touch panels are widely used in various applications because of their capability of allowing direct inputting based on visual information provided by the display.

A resistive-type touch panel and a capacitive-type touch panel are widely known in the art. The resistive-type touch panel includes an upper electrode substrate and a lower electrode substrate having respective transparent conductive films. These substrates are arranged such that the corresponding transparent conductive films face each other. When pressure is applied to a point on the upper electrode substrate, the transparent conductive films are brought into contact with each other, thereby allowing the position of the pressed point to be detected.

The capacitive-type touch panel detects an electrical current as the current flows through a transparent electrode or the like in response to a finger or the like coming into the close proximity of the touch panel, thereby detecting the relevant position.

The capacitive-type touch panel employs a capacitive-coupling-based detection mechanism, and, thus, can detect the position of a point that is touched, even in the absence of pressure being applied. Contact by an insulating object, however, cannot cause its contact position to be detected. The resistive-type touch panel does not require an object coming into contact with the touch panel to be made of any particular type of material. However, certain pressure needs to be applied to the touch panel because position detection is performed based on a physical contact between a transparent conductive film serving as an upper resistive film and a transparent conductive film serving as a lower resistive film.

Failure to detect the position of a contact made by an insulating object limits the places and applications in which the touch panel is used. The area of use thus ends up being limited.

Accordingly, it may be desirable to provide a touch panel that can be operated by an insulating object coming in contact with the touch panel, even in the absence of applied pressure.

[Patent Document 1] Japanese Patent Application Publication No. 2000-76014

[Patent Document 2] Japanese Patent Application Publication No. 2006-268262

[Patent Document 3] Japanese Patent Application Publication No. 2010-157029

[Patent Document 4] Japanese Patent Application Publication No. 2011-221676

SUMMARY OF THE INVENTION

It is a general object of the present invention to provide a touch panel that substantially obviates one or more problems caused by the limitations and disadvantages of the related art.

According to an embodiment, a touch panel includes a transparent dielectric substrate having a generally rectangular shape, a first conductive film formed on a first surface of the dielectric substrate, a second conductive film formed on a second surface of the dielectric substrate, four electrodes formed at four respective corners of the first conductive film, four current detecting units coupled to the four electrodes, respectively, and an alternating-current power supply configured to apply alternating-current voltage between the first conductive film and the second conductive film, wherein the alternating-current power supply is electrically coupled to the first conductive film through the four current detecting units and the four electrodes.

According to at least one embodiment, a touch panel can be operated by an insulating object coming in contact with the touch panel, even in the absence of applied pressure.

BRIEF DESCRIPTION OF THE DRAWINGS

Other objects and further features of the present invention will be apparent from the following detailed description when read in conjunction with the accompanying drawings, in which.

DESCRIPTION OF THE PREFERRED EMBODIMENTS

In the following, embodiments will be described by referring to the accompanying drawings. The same elements are referred to by the same numerals, and a description thereof will be omitted.

<Touch Panel>

Figure 1:
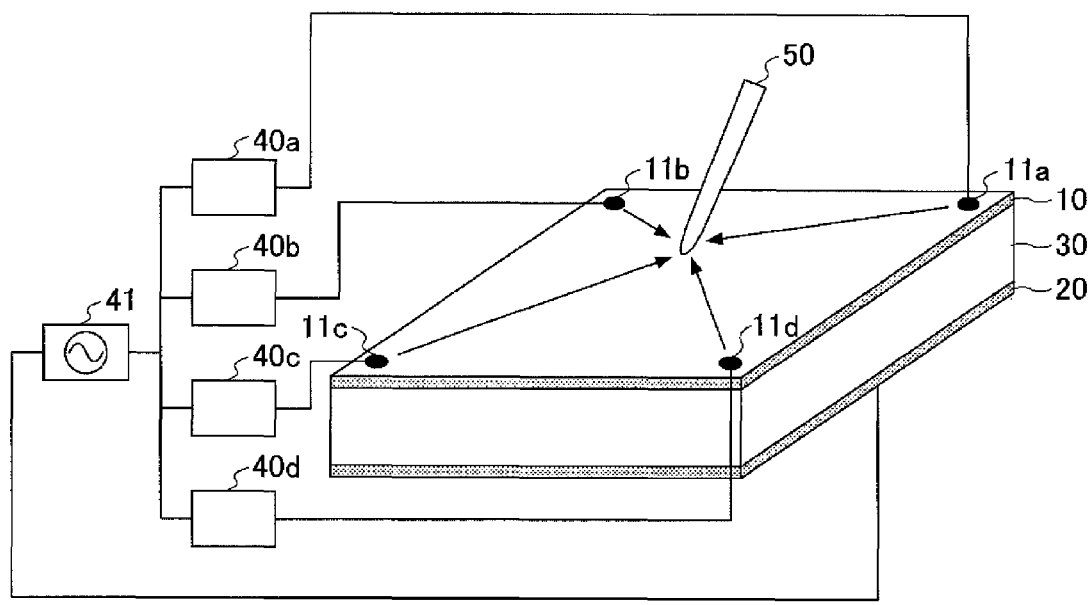
FIG. 1 is a drawing illustrating the structure of a touch panel according to an embodiment.

With reference to FIG. 1, a description will be given of a touch panel according to the present embodiment. The touch panel of the present embodiment includes a first transparent conductive film 10, a second transparent conductive film 20, and a dielectric substrate 30. The first transparent conductive film 10 is formed on a first surface of the dielectric substrate 30, and the second transparent conductive film 20 is formed on a second surface of the dielectric substrate 30. The dielectric substrate 30 is formed of a dielectric material having insulation properties. The first transparent conductive film 10, the second transparent conductive film 20, and the dielectric substrate 30 together constitute a condenser.

The first transparent conductive film 10 and the second transparent conductive film 20 are formed of a transparent conductive material such as ITO (indium tin oxide). In the present embodiment, an image display apparatus such as a liquid crystal display is supposed to be placed on the second surface side of the dielectric substrate 30. In order to allow images displayed on the image display apparatus to be viewed through the touch panel, the first transparent conductive film 10 and the second transparent conductive film 20 are made of a transparent conductive material.

The dielectric substrate 30 has a generally rectangular shape, and is made of a dielectric material such as glass or transparent resin material. Specifically, the dielectric substrate 30 is made of a glass substrate, a resin film, or the like.

Electrodes 11a, 11b, 11c, and 11d are disposed at the four corners, respectively, of the first transparent conductive film 10 formed on the first surface of the dielectric substrate 30. The electrode 11a is coupled to an electric current detecting unit 40a. The electrode 11b is coupled to an electric current detecting unit 40b. The electrode 11c is coupled to an electric current detecting unit 40c. The electrode 11d is coupled to an electric current detecting unit 40d. The electric current detecting units 40a, 40b, 40c, and 40d are also coupled to one of the two terminals of an alternating-current power supply 41. The other terminal of the alternating-current power supply 41 is coupled to the second transparent conductive film 20. The alternating-current power supply 41 applies alternating voltage to the first transparent conductive film 10 and the second transparent conductive film 20, thereby supplying charges responsive to applied polarities to the first transparent conductive film 10 and the second transparent conductive film 20, respectively.

With the above-noted arrangement, the first transparent conductive film 10 receives electric charge through the electrodes 11a, 11b, 11c, and 11d. When this happens, the amounts of charge flowing through the respective electrodes 11a, 11b, 11c, and 11d, i.e., the amounts of electric currents, can be detected at the electric current detecting units 40a, 40b, 40c, and 40d, respectively.

<Method of Detecting Position>

In the following, a method for position detection by the touch panel according to the present embodiment will be described. As was previously described, the touch panel of the present embodiment is coupled to the alternating-current power supply 41, which applies alternating-current voltage between the first transparent conductive film 10 and the second transparent conductive film 20. In this state, the position of a contact point on the first transparent conductive film 10 is detected.

Figure 2A:
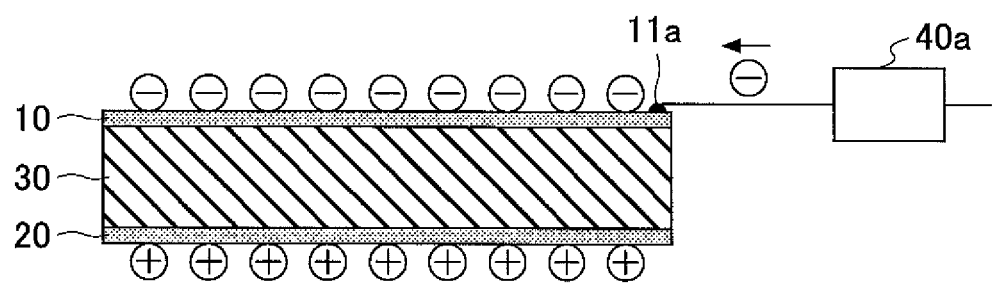
FIGS. 2A and 2B are drawings illustrating the operation of the touch panel according to the embodiment.
Figure 2B:
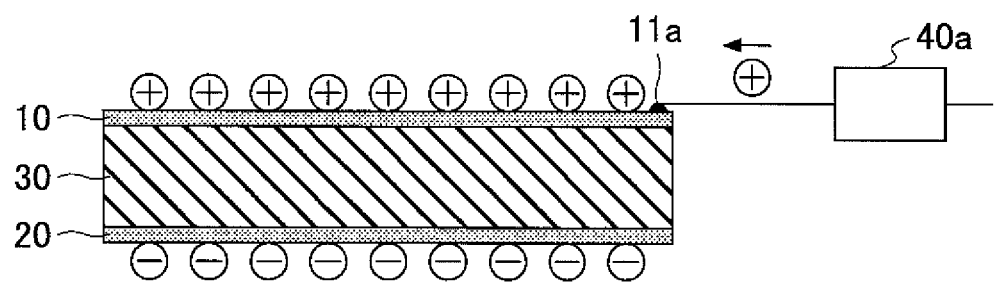

With reference to FIGS. 2A and 2B, a description will be given of the case in which no object is in contact with the first transparent conductive film 10. For the sake of convenience of illustration, FIGS. 2A and 2B illustrate only the electrode 11a among the electrodes supplying electric charge.

In FIG. 2A, the first transparent conductive film 10 is set to negative polarity, and the second transparent conductive film 20 is set to positive polarity. In this case, negative charge composed of electrons is accumulated in the first transparent conductive film 10, and positive charge is accumulated in the second transparent conductive film 20 as the first transparent conductive film 10, the second transparent conductive film 20, and the dielectric substrate 30 constitute a condenser (i.e., capacitor). When this happens, the negative charge accumulated in the first transparent conductive film 10 is supplied through the electrodes 11a, 11b, 11c, and 11d (see FIG. 1). The electric current detecting units 40a, 40b, 40c, and 40d coupled to the electrodes 11a, 11b, 11c, and 11d, respectively, detect the respective amounts of electric currents, i.e., the amounts of supplied negative charge.

Thereafter in FIG. 2B, the first transparent conductive film 10 is set to positive polarity, and the second transparent conductive film 20 is set to negative polarity. In this case, positive charge is accumulated in the first transparent conductive film 10 after negative charge composed of electrons are removed, and negative charge is accumulated in the second transparent conductive film 20 after the positive charge is removed. When this happens, the positive charge accumulated in the first transparent conductive film 10 is supplied through the electrodes 11a, 11b, 11c, and 11d (see FIG. 1). The electric current detecting units 40a, 40b, 40c, and 40d coupled to the electrodes 11a, 11b, 11c, and 11d, respectively, detect the respective amounts of electric currents, i.e., the amounts of supplied positive charge.

In this manner, the application of alternating voltage to the first transparent conductive film 10 and the second transparent conductive film 20 results in the first transparent conductive film 10 and the second transparent conductive film 20 being provided with respective electric charges. When no object is in contact with the first transparent conductive film 10, the amounts of electric currents detected by the electric current detecting units 40a, 40b, 40c, and 40d connected to the respective electrodes 11a, 11b, 11c, and 11d are substantially equal to each other.

In the following, with reference to FIGS. 3A and 33, a description will be given of the case in which an insulating touch pen 50 serving as a contacting object made of an insulation material is in contact with the first transparent conductive film 10. For the sake of convenience of illustration, FIGS. 3A and 3B illustrate only the electrode 11a among the electrodes supplying electric charge.

Figure 3A:
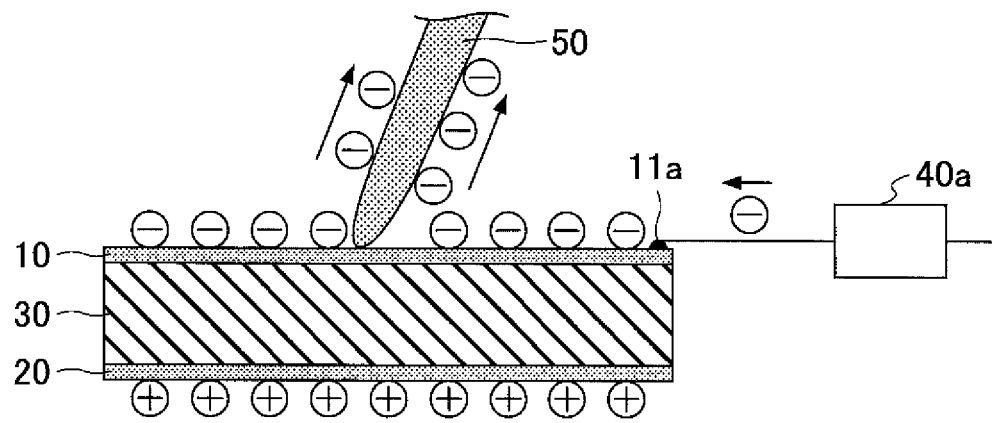
FIGS. 3A and 3B are drawings illustrating the operation of the touch panel according to the embodiment.
Figure 3B:
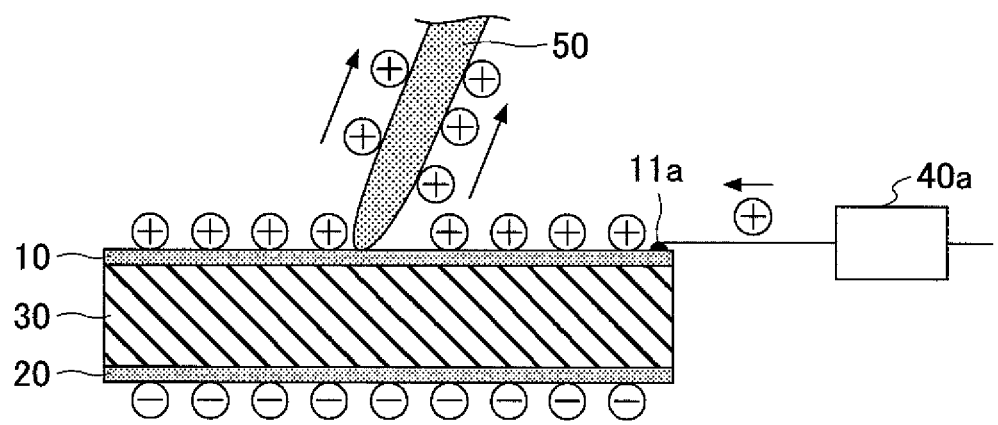

In FIG. 3A, the first transparent conductive film 10 is set to negative polarity, and the second transparent conductive film 20 is set to positive polarity. In this case, negative charge composed of electrons is accumulated in the first transparent conductive film 10, and positive charge is accumulated in the second transparent conductive film 20 as the first transparent conductive film 10, the second transparent conductive film 20, and the dielectric substrate 30 constitute a condenser (i.e., capacitor). When this happens, the negative charge accumulated in the first transparent conductive film 10 is supplied through the electrodes 11a, 11b, 11c, and 11d (see FIG. 1). The electric current detecting units 40a, 40b, 40c, and 40d coupled to the electrodes 11a, 11b, 11c, and 11d, respectively, detect the respective amounts of electric currents, i.e., the amounts of supplied negative charge.

Since the insulating touch pen 50 is made of an insulation material, no electric current flows through the insulating touch pen 50. Instead, electric charge is accumulated on the surface and the like of the insulating touch pen 50. In this manner, the accumulated electric charge is supplied through the electrode 11a and the like, so that the electric current detecting unit 40a and the like can detect the amount of supplied charge. Namely, the insulating touch pen 50 is electrically charged upon coming in contact with the first transparent conductive film 10 while the first transparent conductive film 10 is provided with negative voltage. Compared with the case in which the insulating touch pen 50 is not in contact with the first transparent conductive film 10, the amounts of electric charge supplied through the electrodes, i.e., the amounts of currents detected by the electric current detecting units, are increased due to the presence of the contacting insulating touch pen 50. The detection of the amounts of currents flowing through the electric current detecting units 40a, 40b, 40c, and 40d thus allows determination to be made as to whether the insulating touch pen 50 is in contact with the first transparent conductive film 10.

Further, the electric charge flowing onto the insulating touch pen 50 most predominantly flows through the electrode that is closest to the position of the insulating touch pen 50 being in contact with the first transparent conductive film 10. For example, the electrode 11b may be closest to the position of the insulating touch pen 50 being in contact with the first transparent conductive film 10 as illustrated in FIG. 1. In such a case, the amount of electric charge flowing through the electrode 11b is the largest. The amounts of currents flowing through the electric current detecting units 40a, 40b, 40c, and 40d may be compared to detect the position of a point at which the insulating touch pen 50 is in contact with the first transparent conductive film 10.

A controller (not shown) such as a central processing unit may be provided to detect the position of a contact point at which an object is in contact with the first transparent conductive film 10. Four detected current values detected by the electric current detecting units 40a, 40b, 40c, and 40d may be digital values, which are supplied to the controller. The controller may compare the supplied current values with values stored in memory in advance to detect the presence of the contacting object. The values stored in memory may be electric current values detected by the electric current detecting units 40a, 40b, 40c, and 40d in the absence of any object being in contact with the first transparent conductive film 10. The controller may also compare the supplied current values with each other to determine the position of the contact point.

As illustrated in FIG. 3B, the first transparent conductive film 10 may be set to positive polarity, and the second transparent conductive film 20 may be set to negative polarity. In this case, positive charge is accumulated in the first transparent conductive film 10 after negative charge is removed, and negative charge composed of electrons is accumulated in the second transparent conductive film 20 after the positive charge is removed. When this happens, the positive charge accumulated in the first transparent conductive film 10 is supplied through the electrodes 11a, 11b, 11c, and 11d (see FIG. 1). The electric current detecting units 40a, 40b, 40c, and 40d coupled to the electrodes 11a, 11b, 11c, and 11d, respectively, detect the respective amounts of electric currents, i.e., the amounts of supplied positive charge.

In this case, similarly to the preceding case, the insulating touch pen 50 is made of an insulation material, so that no electric current flows through the insulating touch pen 50. Instead, electric charge is accumulated on the surface and the like of the insulating touch pen 50. In this manner, the accumulated electric charge is supplied through the electrode 11a and the like, so that the electric current detecting unit 40a and the like can detect the amount of supplied charge. Namely, the insulating touch pen 50 is electrically charged upon coming in contact with the first transparent conductive film 10 while the first transparent conductive film 10 is provided with positive voltage. Compared with the case in which the insulating touch pen 50 is not in contact with the first transparent conductive film 10, the amounts of electric charge supplied through the electrodes, i.e., the amounts of currents detected by the electric current detecting units, are increased due to the presence of the contacting insulating touch pen 50. The detection of the amounts of currents flowing through the electric current detecting units 40a, 40b, 40c, and 40d thus allows determination to be made as to whether the insulating touch pen 50 is in contact with the first transparent conductive film 10.

Further, the electric charge flowing onto the insulating touch pen 50 most predominantly flows through the electrode that is closest to the position of the insulating touch pen 50 being in contact with the first transparent conductive film 10. For example, the electrode 11b may be closest to the position of the insulating touch pen 50 being in contact with the first transparent conductive film as illustrated in FIG. 1. In such a case, the amount of electric charge flowing through the electrode 11b is the largest. The amounts of currents flowing through the electric current detecting units 40a, 40b, 40c, and 40d may be compared to detect the position of a point at which the insulating touch pen 50 is in contact with the first transparent conductive film 10.

The amount of electric current flowing through the electrode lie or the like due to the application of alternating voltage continues to flow in one direction until positive charge is accumulated in the insulating touch pen 50 after the removal of negative charge. Because of this, the amount of electric current detected by the electric current detecting unit 40a or the like becomes relatively large.

As described above, the touch panel of the present embodiment detects the position of a contact point even when an insulating body such as the insulating touch pen 50 comes in contact with the first transparent conductive film 10. The description of the present embodiment has been given of a case in which the insulating body coming in contact with the first transparent conductive film 10 is the insulating touch pen 50. Nonetheless, the touch panel of the present embodiment does not require the object coming in contact with the first transparent conductive film 10 to be any particular article, and can detect the position of a contact point regardless of what the object is.

<Connection of Flexible Substrate>

In the following, a description will be given of a touch panel to which a flexible substrate is connected according to the present embodiment. A flexible substrate is also referred to as a flexible printed circuit (FPC), and includes an insulating film and wires formed thereon.

Figure 4:
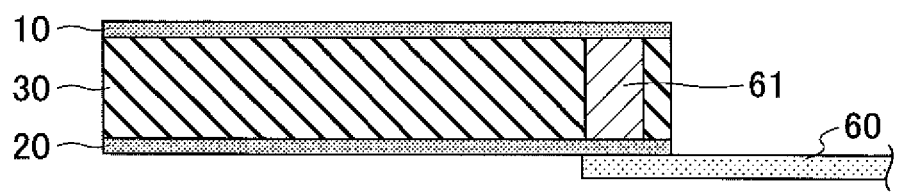
FIG. 4 is a drawing illustrating the structure of a touch panel to which a flexible substrate is attached according to the embodiment.

As illustrated in FIG. 4, the configuration of the present embodiment may be such that the dielectric substrate 30 has a through-hole formed therein, which is filled with a connecting through part 61 made of a conductive material such as metal for providing a path between the two surfaces of the dielectric substrate 30, with a flexible substrate 60 being connected to the second transparent conductive film 20. The flexible substrate 60 may also be electrically coupled to the connecting through part 61 via a hole or the like formed through the second transparent conductive film 20. With the provision of the connecting through part 61, an electrode formed on the flexible substrate 60 may be electrically coupled to the first transparent conductive film 10 through the connecting through part 61. It thus suffices for the flexible substrate 60 to be attached only to the opposite side of the dielectric substrate 30 to the first transparent conductive film 10.

Figure 5:
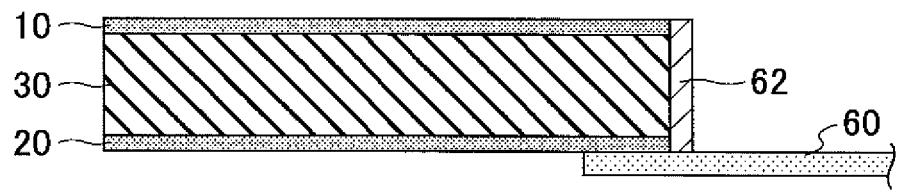
FIG. 5 is a drawing illustrating the structure of a touch panel to which a flexible substrate is attached according to the embodiment.

As illustrated in FIG. 5, the configuration of the present embodiment may be such that a side connecting part 62 made of a conductive material such as metal is formed on a side face of the dielectric substrate 30, with the flexible substrate 60 being connected to the second transparent conductive film 20 and to the side connecting part 62. With the provision of the side connecting part 62, an electrode formed on the flexible substrate 60 may be electrically coupled to the first transparent conductive film 10 through the side connecting part 62. It thus suffices for the flexible substrate 60 to be attached only to the opposite side of the dielectric substrate 30 to the first transparent conductive film 10.

Figure 6:
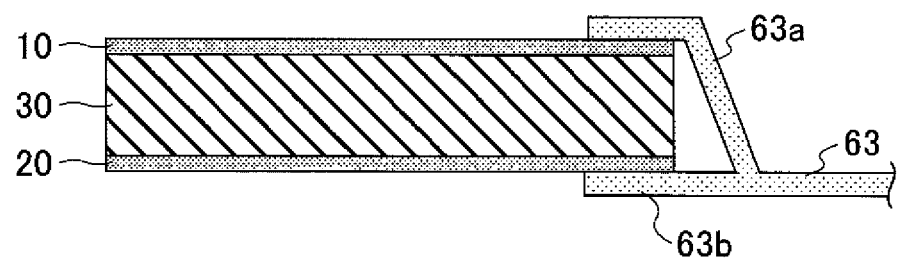
FIG. 6 is a drawing illustrating the structure of a touch panel to which a flexible substrate is attached according to the embodiment.

As illustrated in FIG. 6, the configuration of the present embodiment may be such that a flexible substrate 63 is provided that has two branching parts having electrodes formed thereon. Specifically, the flexible substrate 63 has a first part 63a and a second part 63b on which an electrode is formed. The first part 63a of the flexible substrate 63 is connected to the first transparent conductive film 10 and the second part 63b of the flexible substrate 63 is connected to the second transparent conductive film 20.

Figure 7:
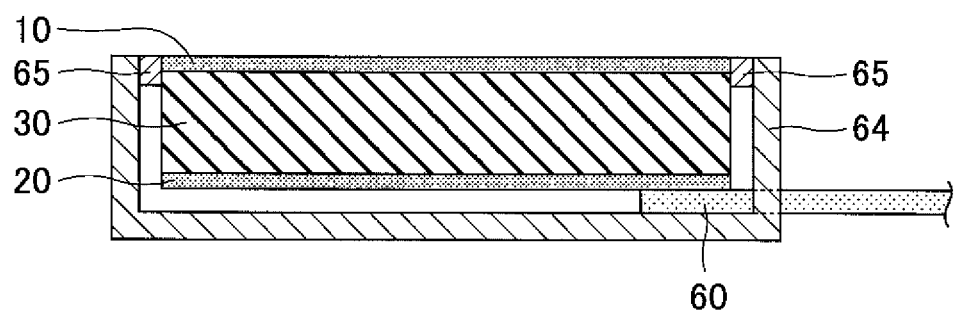
FIG. 7 is a drawing illustrating the structure of a touch panel to which a flexible substrate is attached according to the embodiment.

As illustrated in FIG. 7, the configuration of the present embodiment may be such that a case unit 64 made of a conductive material such as metal is provided to cover the first transparent conductive film 10, the second transparent conductive film 20, and the dielectric substrate 30. Specifically, electrodes on the flexible substrate 60 are electrically connected to the second transparent conductive film 20 and to the case unit 64, respectively, and a connecting part 65 made of a conductive material connects between the case unit 64 and the first transparent conductive film 10. The provision of the case unit 64 made of a conductive material such as metal to cover the second transparent conductive film 20 on the opposite side of the dielectric substrate 30 to the first transparent conductive film 10 serves to prevent the second transparent conductive film 20 from being affected by an external disturbance.

Further, although the present invention is not limited to these embodiments, but various variations and modifications may be made without departing from the scope of the present invention.

The present application is based on Japanese priority application No. 2012-098233 filed on Apr. 23, 2012, with the Japanese Patent Office, the entire contents of which are hereby incorporated by reference.

What is claimed is:

1. A touch panel, comprising:
   a transparent dielectric substrate having a generally rectangular shape;
   a first conductive film formed on a first surface of the dielectric substrate;
   a second conductive film formed on a second surface of the dielectric substrate;
   four electrodes formed at four respective corners of the first conductive film, each of the four electrodes being electrically connected to a corresponding one of four current detecting units; and
   an alternating-current power supply configured to apply alternating-current voltage between the first conductive film and the second conductive film,
   wherein when an insulating object is placed in direct contact with the first conductive film, the four current detecting units detect electric currents flowing at the fours electrodes, respectively, the electric currents flowing as a result of electrical charge of the insulating object placed in direct contact with the first conductive film, and a position at which the insulating object is in direct contact with the first conductive film is determined based on respective amounts of the detected electric currents.

2. The touch panel as claimed in claimed 1, wherein the insulating object is an insulating touch pen.

* * * * *